(12) United States Patent
Colburn et al.

(10) Patent No.: US 7,579,137 B2
(45) Date of Patent: *Aug. 25, 2009

(54) METHOD FOR FABRICATING DUAL DAMASCENE STRUCTURES

(75) Inventors: Matthew E. Colburn, Hopewell Junction, NY (US); Dario L. Goldfarb, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 557 days.

This patent is subject to a terminal disclaimer.

(21) Appl. No.: 11/317,089

(22) Filed: Dec. 24, 2005

(65) Prior Publication Data

US 2007/0148598 A1 Jun. 28, 2007

(51) Int. Cl.
*G03F 7/26* (2006.01)

(52) U.S. Cl. .................................. 430/313; 430/394
(58) Field of Classification Search .............. 430/311, 430/313, 394
See application file for complete search history.

(56) References Cited

U.S. PATENT DOCUMENTS 5,288,660 A * 2/1994 Hua et al. .................... 438/571
5,370,973 A * 12/1994 Nishii ......................... 430/315

* cited by examiner

*Primary Examiner*—Kathleen Duda
(74) *Attorney, Agent, or Firm*—F. Chau & Associates, LLC

(57) ABSTRACT

A method for fabricating a dual damascene structure includes providing a multi-layer photoresist stack comprising a first photoresist layer and a second photoresist layer, wherein each photoresist layer has a distinct dose-to-clear value, exposing said photoresist stack to one or more predetermined patterns of light, and developing said photo-resist layers to form a multi-tiered structure in the photo-resist layers.

1 Claim, 6 Drawing Sheets

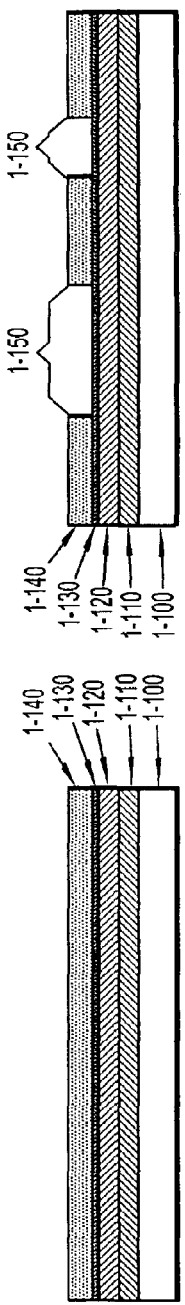
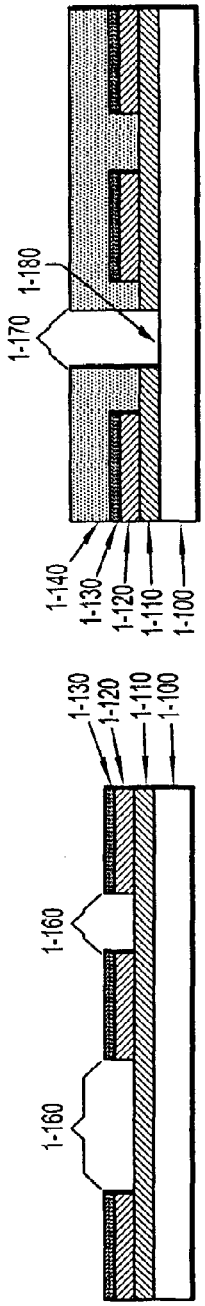
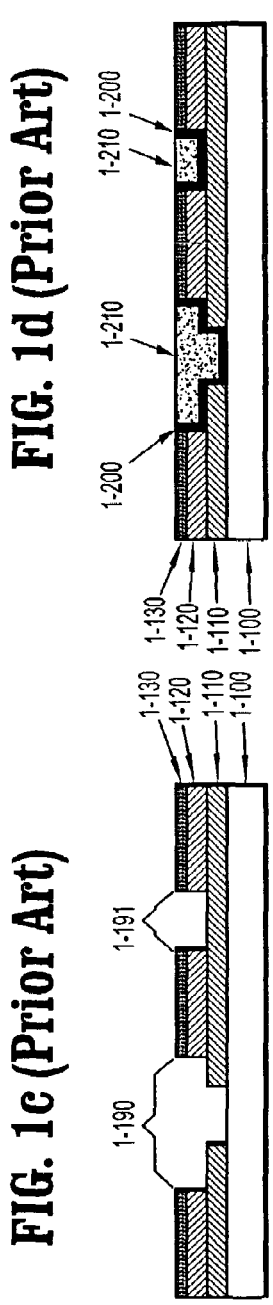
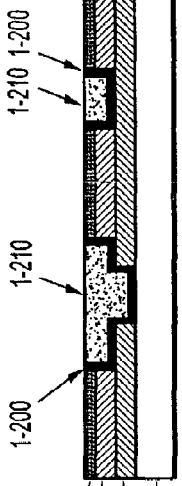
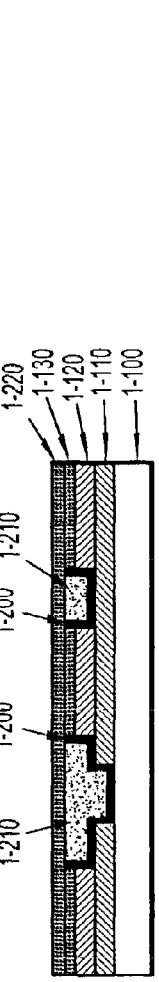

METHOD FOR FABRICATING DUAL DAMASCENE STRUCTURES

TECHNICAL FIELD

This present invention relates generally to the fabrication of very-large scale integrated (VLSI) or ultra-large scale integrated (ULSI) circuits, and more particularly, to the fabrication of a dual damascene structure using a multilayer photoresist stack in conjunction with a multi level exposure.

DISCUSSION OF THE RELATED ART

The fabrication of Very-Large Scale Integrated (VLSI) or Ultra-Large Scale Integrated circuit (ULSI) involves the use of metallic wiring that connects individual devices in a semiconductor chip to one another. The wiring interconnect network of the circuit includes two features: line features that traverse a distance across the chip, and via features which connect lines in different layers together. Historically, both layers are made from an inorganic glass like silicon dioxide ($SiO_2$) or a fluorinated silica film deposited by plasma enhanced chemical vapor deposition (PECVD).

One method of creating a wiring network on such small scale is known as the dual damascene (DD) process, shown schematically in FIGS. 1a-1g. In a standard DD process, an interlayer dielectric (ILD), shown as two layers, a via level dielectric 1-110 and a line level dielectric 1-120, is formed on a substrate 1-100, as shown in FIG. 1a. The two layers 1-110, 1-120 are shown separately for clarity of the process flow description. These two layers can be made from the same or from different insulating films, and in the former case can be applied as a single monolithic layer. A hard mask layer 1-130 is optionally employed to facilitate etch selectivity and can serve as a polish stop, as is well known in the art.

In the dual damascene process, the position of lines 1-150 and vias 1-170 can be defined lithographically in photoresist layers, 1-140, as shown in FIGS. 1b and 1d, and transferred into hard mask 1-130 and ILD layers 1-110, 1-120 using reactive ion etching processes. The process sequence shown in FIGS. 1a-1g is known as a "line-first" approach because trenches 1-160 which house the line feature are etched first, as shown in FIG. 1c. Referring to FIG. 1d, after the trench formation, lithography is used to define a via pattern 1-170 in the photoresist layer 1-140 which is formed in the dielectric layers 1-110, 1-120 to generate a via opening 1-180.

A dual damascene via structure 1-190 and trench structure 191 is shown in FIG. 1e after the photoresist layer 1-140 has been stripped. The structures 1-190, 1-191 are coated with a conducting liner material or material stack 1-200 that will protect conductor metal lines and vias and serve as an adhesion layer between the conductor and the ILD. The recesses are then filled with a conducting fill material 1-210 over the surface of the patterned substrate. The fill 1-210 can be accomplished by electroplating copper, although other methods such as chemical vapor deposition (CVD) and other materials such as Al or Au can also be used. The fill 1-210 and liner materials 1-200 are then chemically-mechanically polished (CMP) to be coplanar with the surface of the hard mask 1-130, as shown in FIG. 1f.

A capping material or blanket film 1-220 is deposited over the metal 1-210, as is depicted in FIG. 1g, to passivate the exposed metal surface 1-210 and to serve as a diffusion barrier between the metal 1-210 and any additional ILD layers to be deposited over the film 1-220. Silicon nitride, silicon carbide, and silicon carbonitride films deposited by PECVD are typically used as the capping material 1-220. This process sequence is repeated for each level of interconnects on the device. Since two interconnect features are defined to form a conductor in-lay within an insulator by a single polish step, the process of FIGS. 1a-1g is designated a dual damascene process.

The above manufacturing methods for dual damascene structures typically involve a minimum of two lithography exposures and two reactive ion etch steps, as well as the deposition steps such as those shown in FIGS. 1a-1g. Typically two lithography steps are required. For each lithography step, there may be several reactive ion etch steps required to open any antireflective coatings, hardmask stacks, and the dielectric material itself.

FIG. 2 illustrates a conventional method of using a multi-transparency reticle for generating a multi-tier structures in a single gray tone photoresist. As shown in FIG. 2, a reticle 2-90 comprising three materials, 2-92, 2-94, 2-96, having three distinct transparency regions of 0%, 30%, 100%, respectively, is exposed to a single exposure 2-98 generating an aerial image 2-100 such that a photoresist 2-102 upon development leaves a multitiered structure having three distinct thicknesses 2-104, 2-106, 2-108. This process utilizes a Coat-Expose-Develop sequence in a gray tone resist. Gray tone resists typically have linear thickness-to-dose contrast curves. This places undue process latitude responsibility on the reticle fabrication.

FIGS. 3a-3c illustrate a conventional method of using a multilayered resist structure for generating a multitiered structure in a substrate. As shown in FIG. 3a, a resist 3-81 is coated over a previously-developed resist 3-71, then exposed to light 3-82 through a mask 3-83. The resists 3-71, 3-81 are developed to form a multitiered structure 3-162 on a substrate 3-51 having a material to be patterned 3-52, as shown in FIG. 3b. In FIG. 3c, the multi-tiered structure 3-162 is transferred into the material 3-52 according to processes well known in the art to generate a final structure 3-163 that is commensurate with the original multitiered pattern 3-162. This process utilizes a coat-expose-develop-coat-expose-develop sequence using two resists. This process requires the first resist layer 3-71 and second resist layer 3-81 to be immiscible and for the second layer 3-81 to have excellent resist contrast and dissolution properties in order to allow for full development at the bottom of the pattern previously imaged in the first resist layer 3-71. This process requires that two masks be projected into a sequentially coated, exposed, and developed resist. It only reduces processing by one etch step but adds rework complexity.

SUMMARY OF INVENTION

Exemplary embodiments of the invention as described herein generally include methods for fabricating a multi-tiered structure using an N-level reticle and an N-level photoresist stack, and more specifically methods for fabricating a dual damascene structure using an N-level reticle and N-level photoresist stack.

According to an aspect of the invention, there is provided a method for fabricating a dual damascene structure, comprising providing a photoresist stack comprising a plurality of photoresist layers formed on a semiconductor substrate, wherein each photoresist layer has a distinct dose-to-clear value, exposing said photoresist stack to a first predetermined pattern of light, and developing said photo-resist layers to form a multi-tiered structure in the photo-resist layers.

In a further aspect of the invention, the method further comprises transferring the multi-tiered structure into an interlayer dielectric layer of the semiconductor substrate.

In a further aspect of the invention, the photoresist stack further comprises a top anti-reflective layer and a bottom anti-reflective layer.

In a further aspect of the invention, each of said photoresist layers are sensitive to a same wavelength of light, each of said photoresist layers each have a different, distinct dose-to-clear value, and said first predetermined pattern of light comprises said same wavelength of light.

In a further aspect of the invention, the first predetermined pattern of light comprises an image which comprises a line-space pattern and a via pattern.

In a further aspect of the invention, the method further comprises providing a reticle having a plurality of distinct transparency regions, wherein exposing said photoresist stack comprises passing light through said reticle to create said first predetermined pattern of light.

In a further aspect of the invention, the reticle comprises one or more of an optical proximity corrected pattern, an assist feature, and a phase shift pattern.

In a further aspect of the invention, the photoresist layers are immiscible.

In a further aspect of the invention, the photoresists layers are positive-tone resists, and wherein a threshold exposure dose of each photoresist layer monotonically increases from a top photoresist layer to a bottom photoresist layer, wherein the top photoresist layer is closest to a light source.

In a further aspect of the invention, the photoresists layers are negative-tone resists, and wherein a threshold exposure dose of each photoresist layer monotonically decreases from a top photoresist layer to a bottom photoresist layer, wherein the top photoresist layer is closest to a light source.

In a further aspect of the invention, each said photoresist layer is sensitive to a different wavelength of light, and further comprising exposing said photoresist stack to a plurality of predetermined patterns of light, wherein each pattern of light comprises light of one of said different wavelengths of light.

According to another aspect of the invention, there is provided a system for fabricating a dual damascene structure, comprising a photoresist stack comprising a plurality of photoresist layers formed on a semiconductor substrate, wherein each photoresist layer has a distinct dose-to-clear value, and a reticle having a plurality of distinct transparency regions, wherein light is passed through said reticle to expose said photoresist stack to a predetermined pattern of light which comprises a line-space pattern and a via pattern.

According to another aspect of the invention, there is provided a method for fabricating a dual damascene structure, comprising providing a photoresist stack comprising a first photoresist layer on top of a second photoresist layer formed on top of a semiconductor substrate, wherein said first photoresist layer is sensitive to a first wavelength of light and said second photoresist layer is sensitive to a second wavelength of light, exposing said photoresist stack to a first predetermined pattern of light comprising said first wavelength, exposing said photoresist stack to a second predetermined pattern of light comprising said second wavelength, and developing said photo-resist layers to form a multi-tiered structure in the photo-resist layers.

In a further aspect of the invention, the method further comprises transferring the multi-tiered structure into an interlayer dielectric layer of the semiconductor substrate, wherein said interlayer dielectric layer is under said second photoresist layer.

In a further aspect of the invention, the first and second predetermined patterns of light form an image which comprises a line-space pattern and a via pattern.

In a further aspect of the invention, the method further comprises providing an opaque layer between said first and second photoresist layers, exposing said opaque layer to a blanket exposure after said exposure to said first predetermined pattern of light in order to render said opaque layer transparent.

According to another aspect of the invention, there is provided a method for fabricating a dual damascene structure, comprising providing a photoresist stack comprising a first photoresist layer on top of a second photoresist layer formed on top of a semiconductor substrate, wherein said first and second photoresist layers are sensitive to a same wavelength of light, and said first and second photoresist layers each have a different, distinct dose-to-clear value, exposing said photoresist stack to a first predetermined pattern of light comprising said wavelength of light, and developing said photo-resist layers to form a multi-tiered structure in the photo-resist layers.

In a further aspect of the invention, the method further comprises transferring the multi-tiered structure into an interlayer dielectric layer of the semiconductor substrate, wherein said interlayer dielectric layer is under said second photoresist layer.

In a further aspect of the invention, the first photoresist layer and said second photoresist layer have substantially different exposure sensitivities, and wherein a first mask is provided to create said first predetermined pattern of light; and further comprising exposing said photoresist stack to a second predetermined pattern of light having a substantially different intensity from said first predetermined pattern, using a second mask to create said second predetermined pattern.

In a further aspect of the invention, the second photoresist layer is a line-level resist, and further comprising bleaching said second photoresist layer after said exposure.

In a further aspect of the invention, the method further comprises providing an opaque layer between said first and second photoresist layers, exposing said opaque layer to a blanket exposure after said exposure to said first predetermined pattern of light in order to render said opaque layer transparent, and exposing said photoresist stack to a second predetermined pattern of light.

In a further aspect of the invention, the method further comprises providing a reticle having an opaque is region, a semi-transparent region, and an open region, wherein light is passed through said reticle to expose said photoresist stack to said first predetermined pattern of light.

In a further aspect of the invention, the photoresist layers are positive-tone resists, and wherein said second photoresist layer has a larger threshold exposure dose than said first photoresist layer.

In a further aspect of the invention, the photoresist layers are negative-tone resists, and wherein said second photoresist layer has a smaller threshold exposure dose than said first photoresist layer.

In a further aspect of the invention, the first predetermined pattern of light forms an image which comprises a line-space pattern and a via pattern.

BRIEF DESCRIPTION OF THE DRAWINGS

FIGS. 1a-1g depict a conventional dual damascene fabrication process.

DETAILED DESCRIPTION OF EXEMPLARY EMBODIMENTS

Exemplary embodiments of the invention as described herein generally include methods for producing a dual damascene using an n-level reticle and an n-level resist coating. While there are a multitude of embodiments possible, a subset are detailed here. In the interest of clarity, not all features of an actual implementation which are well known to those of skill in the art are described in detail herein.

According to an embodiment of the invention, the optical properties of different lithographic photoresists are exploited. Typically, short-wavelength photoresists are transparent at both shorter and longer wavelengths, while long-wavelength photoresists tend to be absorbing at shorter wavelengths. For example, phenolic resins are relatively transparent at 248 nm but absorbing at 193 nm, but norborene-based resist tend to be transparent at 248 nm and at 193 nm. Many materials useful as photoresist layers have tailorable absorbance peaks. An example is anthracene-like chromophore, which can have peak absorbance tailored to be less than 400 nm. Anthracene will absorb heavily in the 365 nm region and can also absorb at shorter wavelengths such as 193 nm.

According to another embodiment of the invention, the dose-to-clear values of different lithographic photoresists is exploited. The dose-to-clear value is a measure of the amount of exposure required for a photoresist to fully develop. A material with a distinct dose-to-clear response will typically have a sharp exposure-development curve, and will not form a latent image for an exposure less than the dose-to-clear value. The sensitivity of the resist can be modulated by one or more of the following: differences in photoacid concentration, differences in base loading, differences in polymer structure, differences in mechanism of dissolution, differences in amount or effectiveness of dissolution inhibitor, and in the case of negative tone resists, differences in crosslinker concentration.

A multitier reticle in accordance with an embodiment of the invention would be able to project an aerial image commensurate with the line-space and via patterns in a dual damascene structure. Such a multitier reticle would include one or more of optical proximity corrected patterns, assist features, and phase shift patterns, as are known in the art.

Figure 2:
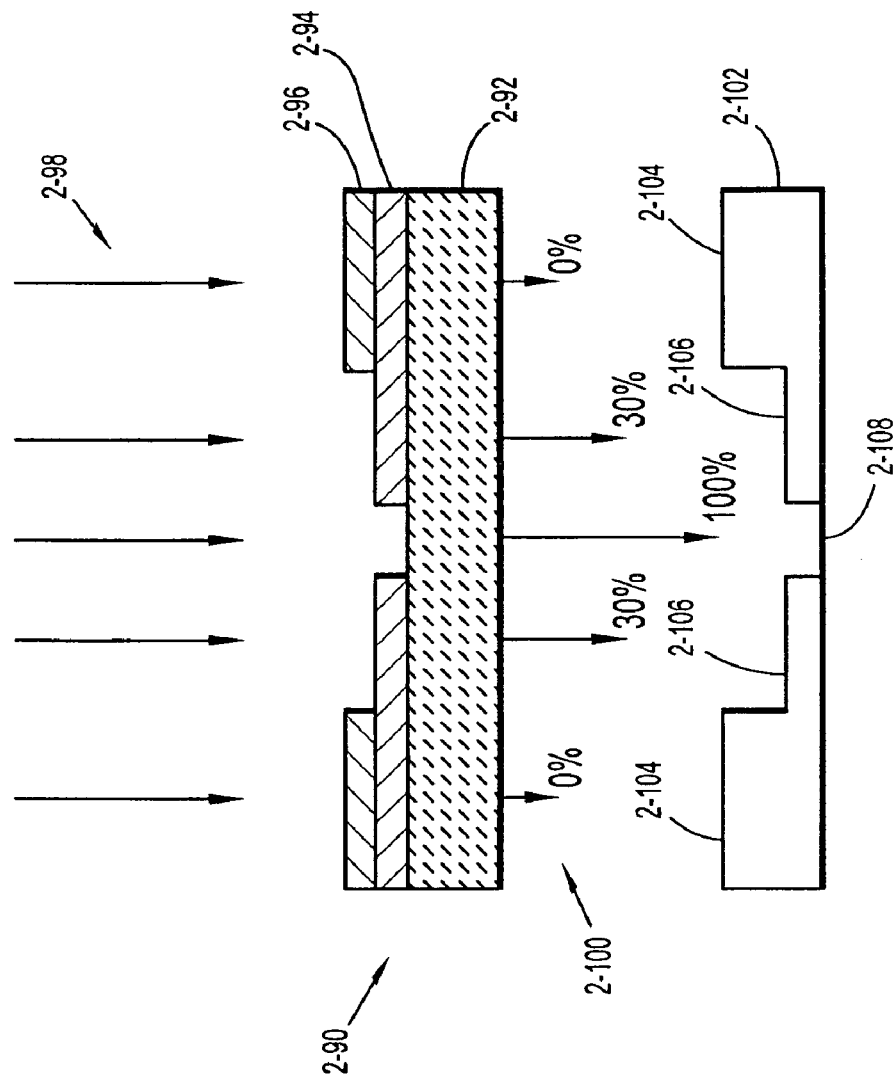
FIG. 2 depicts a conventional two-layer imaging process using a single resist.
Figure 3B:
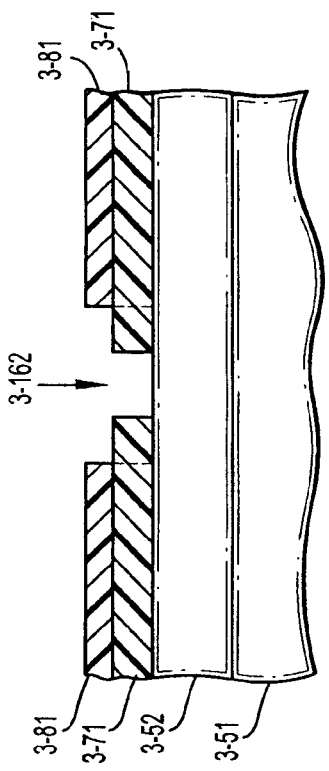
FIGS. 3a-3c depict a conventional two-layer imaging process using two coatings, two exposures, and two development sequences.
Figure 3A:
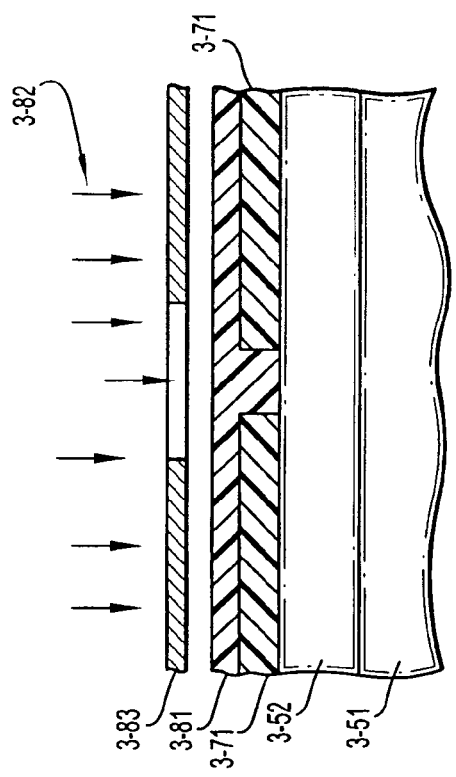
Figure 3C:
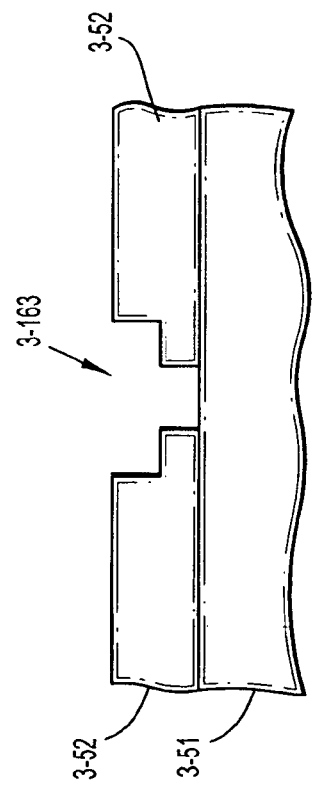

FIGS. 4a-4e are schematic diagrams that depict a photolithography process according to an exemplary embodiment of the invention. More specifically, the photolithographic process depicted in FIGS. 4a-4e utilizes two coatings, two exposures, and a single development sequence, which reduces the processing relative to the photolithographic process shown in FIGS. 3a-3d by one step. The process depicted in FIGS. 4a-4e improves the process latitude relative to that shown in FIG. 2 by utilizing a multilayered photoresist stack having distinct dose-to-clear values instead of a continuous graytone contrast curve. For the sake of clarity, FIGS. 4a-4e do not depict optional intermediate layers that can be used for compatibility issues such as intermixing and latent image profile enhancement.

Figure 4B:
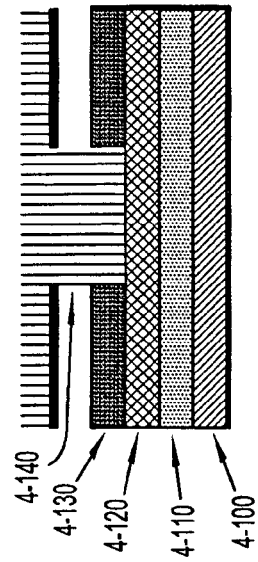
FIGS. 4a-4e are schematic diagrams that depict a photolithography process according to an exemplary embodiment of the invention.
Figure 4D:
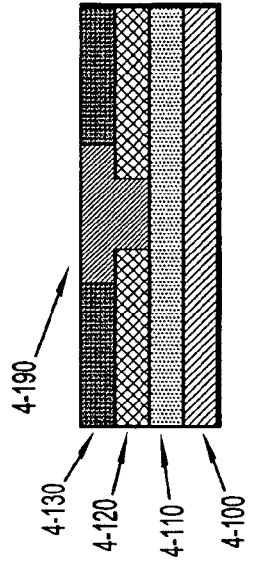
Figure 4A:
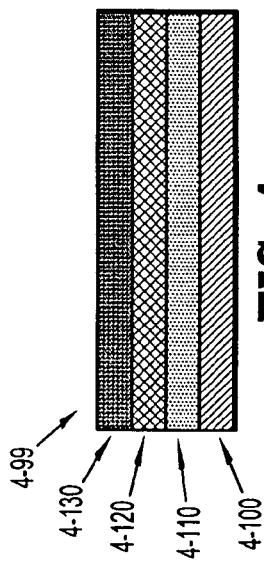

Referring now to FIG. 4a, a semiconductor device 4-99 is shown that includes a substrate 4-100 coated with an interlayer dielectric (ILD) 4-110 and a photoresist stack comprising a first photoresist 4-120 sensitive to a first wavelength of light, and a second photoresist 4-130 sensitive to a second wavelength of light. In one embodiment of the invention, the first photoresist 4-120 is a 248 nm resist and the second photoresist 4-130 is a 193 nm resist. These wavelength sensitivities are exemplary, and photoresists of other wavelength sensitivities are within the scope of an embodiment of the invention.

Figure 4C:
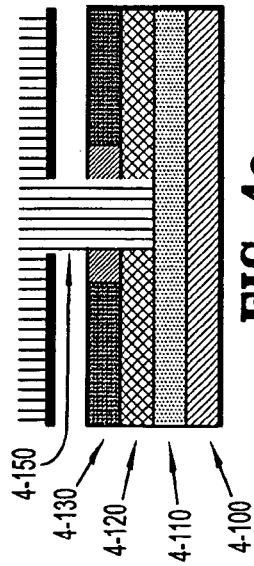

Referring now to FIG. 4b, the device 4-99 is exposed to a projected image 4-140 using the second wavelength of light. The light is projected into the second photoresist 4-130 but is absorbed by the first photoresist 4-120 in a relatively thin layer. In an embodiment where the second photoresist 4-130 is a 193 nm resist, the light will be 193 nm wavelength. Referring now to FIG. 4c, a second projected light pattern 4-150 of the first wavelength can penetrate through the exposed section of the second photoresist 4-130 and into the first photoresist 4-120 causing a similar latent image in the first photoresist 4-120. In an embodiment where the first photoresist 4-120 is a 248 nm resist, the light will be 248 nm wavelength.

Figure 4E:
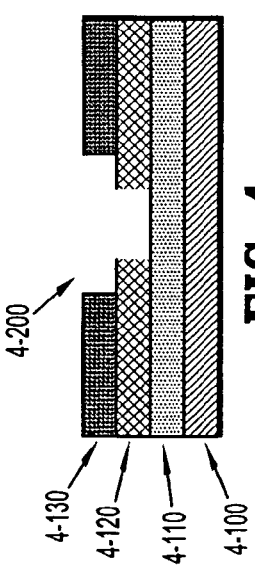

After a short post exposure bake is performed, the latent image of the projected light will result in a chemical reaction rendering a region 4-190 within the layers 4-120, 4-130 soluble in a developer, as indicated in FIG. 4d. The two photoresist layers 4-120, 4-130 can then be developed in a conventional developer in a single step to form a Dual Damascene pattern 4-200 in the resist as shown in FIG. 4e. A typical developer according to one embodiment of the invention is a 0.26 M aqueous base developer, although other developers as are known in the art can also be utilized. The resulting pattern 4-200 can then be transferred using known methods into the underlying interlayer dielectric 4-110 or other material for other applications requiring multilevel structures (not shown). Optionally, if the photoresists 4-120, 4-130, meet the requirements of a standard dielectric, this dual damascene image would be the final structure.

FIGS. 5a-5d are schematic diagrams that depict a photolithography process according to another exemplary embodiment of the invention. More specifically, the photolithographic process depicted in FIGS. 5a-5d utilize a two-layer stack using two coatings, a single exposure, and a single development sequence. Again, processes depicted in FIGS. 5a-5d have improved process latitude compared to the graytone imaging used in the process depicted in FIG. 2, and two fewer process steps relative to the photolithographic process depicted in FIGS. 3a-3d.

Figure 5A:
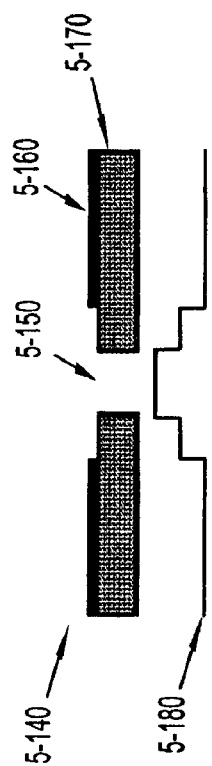
FIGS. 5a-5d are schematic diagrams that depict a photolithography process according to another exemplary embodiment of the invention.
Figure 5B:
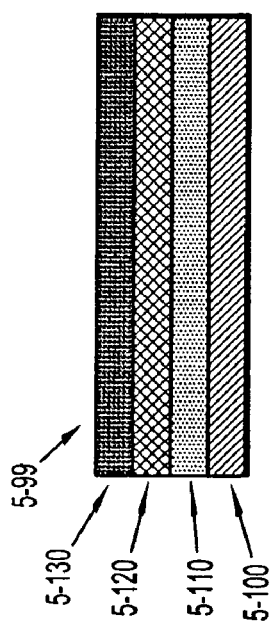
Figure 5C:
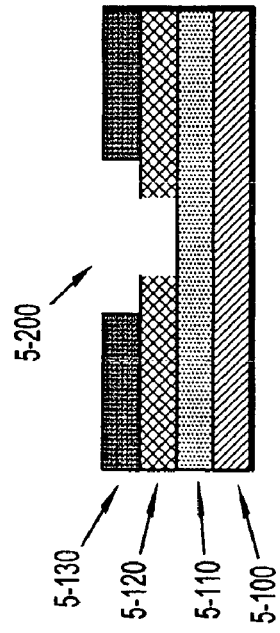
Figure 5D:
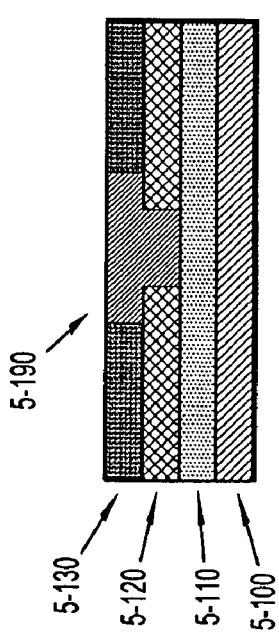

Referring to FIG. 5a, a semiconductor device 5-99 includes a substrate 5-100 upon which an ILD 5-110 is deposited, and is coated with a photoresist stack comprising a first photoresist 5-120 and a second photoresist 5-130. The photoresists 5-120 and 5-130 are sensitive to a same wavelength but have different, distinct dose-to-clear values. Reticle 5-140 is comprised of an opaque region 5-160, a semitransparent region 5-170, and an open region 5-150, as shown in FIG. 5b. When light is projected through the reticle, an intensity profile 5-180 is observed. This profile is projected into the bilayer resist stack 5-120, 5-130 generating a region 5-190 of developable resist, depicted in FIG. 5c. The region 5-190 may require a post-exposure bake for development to occur. Upon development, a dual damascene pattern 5-200 is formed, as shown in FIG. 5d. Again, this pattern 5-200 can then be transferred into the underlying ILD 5-110 using known methods. Optionally, if the resists 5-120, 5-130 can be used as a dielectric layer, this dual damascene pattern 5-200 would be the final structure.

Figure 6B:
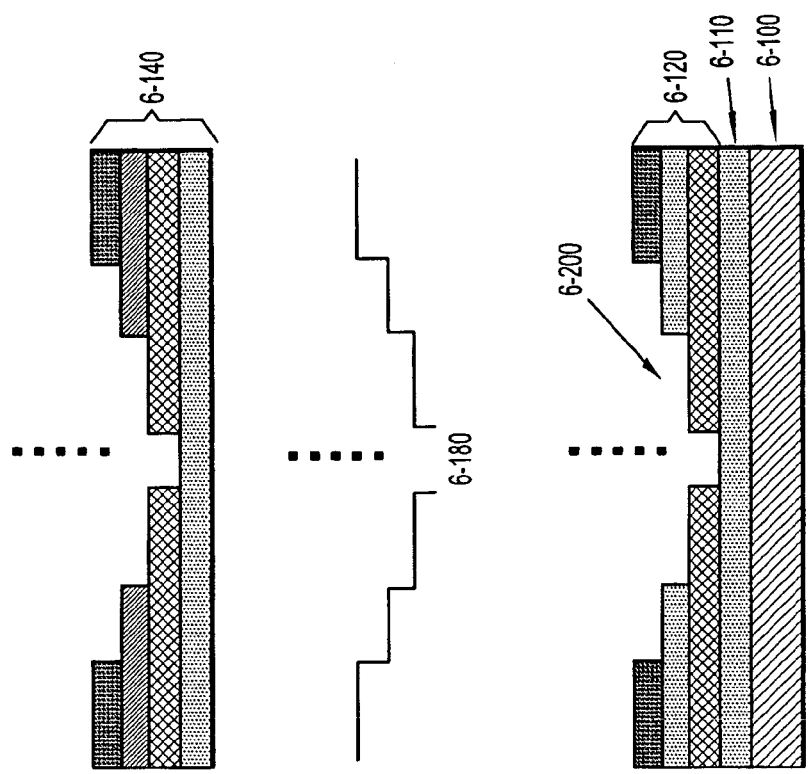
FIGS. 6a-6b are schematic diagrams that depict a photolithography process according to another exemplary embodiment of the invention.
Figure 6A:
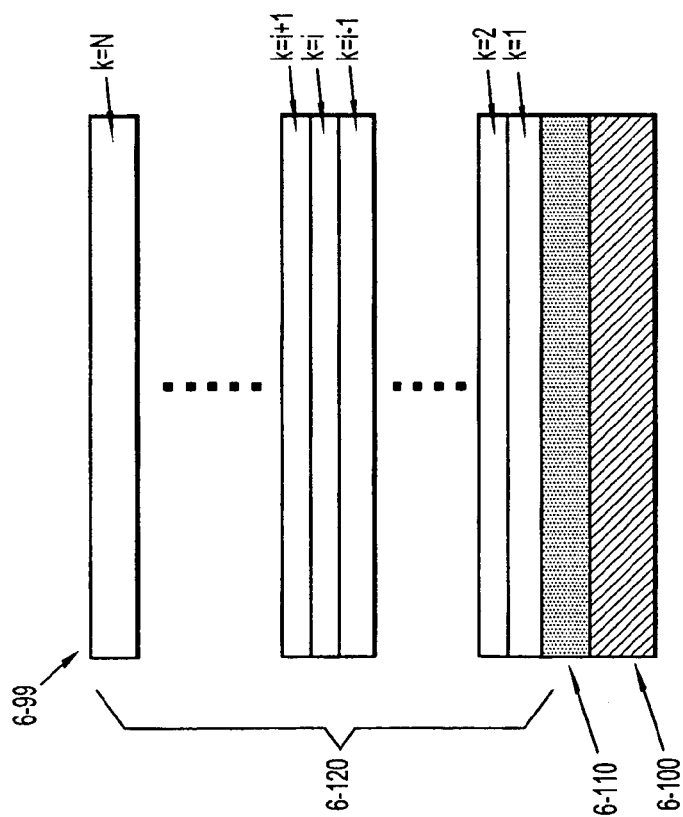

The method described with reference to FIGS. 5a-5d shown for two levels can be extended to an N-level patterning. FIGS. 6a-6b are schematic diagrams that depict a photolithography process according to another exemplary embodiment of the invention. More specifically, the photolithographic process depicted in FIGS. 6a-6b is an N-level imaging process using N-coatings, a single exposure, and a single development sequence.

FIG. 6a depicts a semiconductor device 6-99 that includes an N-layer photoresist stack 6-120 coated on an ILD 6-110 and a substrate 6-100. Each layer in the stack 6-120 is sensitive to the same wavelength but has a different, distinct does-to-clear value. In addition, each layers in the stack 6-120, referenced by k=1, . . . , N, should be immiscible in the layer above and below it. For example, in FIG. 6a, the photoresist layer k=1 is immiscible in the photoresist layer k=2 coated above it and is also immiscible in the dielectric 6-110 or substrate 6-100 below it. Likewise, in FIG. 6a, the $(i)^{th}$ layer in the photoresist stack 6-120 is immiscible in the $(i+1)^{th}$ layer coated above it and also the $(i-1)^{th}$ layer of resist coated below it. Miscibility between the $(i-1)^{th}$ and $(i+1)^{th}$ layers in the photoresist stack 6-120 does not represent an impediment for the construction of the multitiered semiconductor device 6-99.

A multitier reticle 6-140 having a plurality of distinct transparency regions can be used to project a multitiered aerial image profile 6-180, as shown in FIG. 6b, onto the photoresist stack 6-120. A multitier resist pattern 6-200 can be formed by development as shown. Again, this pattern 6-200 can be transferred into the underlying ILD 6-110. Optionally, if the photoresists 6-120 meet the requirements of a standard dielectric, this dual damascene pattern 6-200 would be the final structure.

The embodiment represented by FIGS. 6a-6b assumes an implementation using a positive-tone resist system. Note that for a positive-tone resist system, the upper layers, that is, those layers closer to a light source, should be more sensitive to light, while for a negative resist system, the reverse holds.

In another exemplary embodiment of the invention, the method depicted in FIGS. 5a-5d can be varied wherein there is provided a two layer photoresist stack in which the top layer and bottom layer are sensitive to the same wavelength of light, but the top layer bleaches, becomes less absorbing, as a result of the first exposure or the first post-application bake. In this embodiment, the line level exposure should be exposed first, followed by a process, such as an exposure or a post exposure bake, that results in bleaching.

In another exemplary embodiment of the invention, the methods depicted in either FIGS. 4a-4e or FIGS. 5a-5d can be varied wherein a bleaching layer that is sensitive to a patternless blanket exposure can be utilized. Photochemical bleaching is a common phenomena used routinely in diazonaphthoquinone (DNQ) based i-line resists. In this embodiment, a layer is opaque until a chemical switch occurs that results in a transmission of the desired wavelength. For example, a layer can be placed between a first photoresist and a second photoresist to protect the underlying photoresist from exposure of the overlying photoresist until a switching process occurs. Once the in-between layer has become transparent, the underlying photoresist can be exposed.

According to another exemplary embodiment of the invention, the photoresists comprise photoimagable interlayer dielectrics. For example, if the photoresists shown in FIGS. 4a-6b are capable of performing as an interlayer dielectric, then the topography in the resist pattern after development would be that of the dual damascene structure, within which metal can be deposited according to processes known in the art. All the benefits of a multilayer-multiexposure process according to an embodiment of the invention can be enhanced by eliminating the need for a reactive ion etch transfer of the structure into a traditional non-photoimagable interlayer dielectric.

Further embodiments of the invention comprise permutations of the methods shown in FIGS. 4a-6b. These methods use a combination of Line First, Via First, and/or mixed tone photoresists. Photoresists having substantially different sensitivities can also be used to generate a structure similar to that depicted in FIG. 4e using a single wavelength, two masks and two exposures. The embodiments depicted in FIGS. 4a-4e could also be implemented using 248 nm photoresists on an i-line (365 nm) photoresist or a g-line (412 nm) photoresist. The embodiments depicted in FIGS. 6a-6b could also be implemented using photoresist layers with different wavelength sensitivities, wherein the photoresist stack 6-120 would be exposed to a plurality of light patterns of wavelengths that correspond to the sensitivities of the photoresist layers. Intermediate layers could be utilized to optimize the overall structure, and other layers could be included to improve process latitude, such as a top antireflective layer or a bottom antireflective layer. For the sake of clarity, these additional layers have not been depicted in the drawing figures.

In all of the above described exemplary embodiments, once the resist pattern, such as 4-200, 5-200, 6-200, is transferred into the dielectric 4-110, 5-110, 6-110, the structure formed in the dielectric 4-110, 5-110, 6-110, by the resist pattern can be lined according to known methods with a conventional liner such as Ta, Ru, W, TaN, etc., and a conductive seed layer such as Cu. The structure formed in dielectrics 4-110, 5-110, 6-110, can be plated with Cu and polished to reveal a dual damascene interconnect structure.

Alternatively, if the developed resist pattern 4-200, 5-200, 6-200 can function as a dielectric, or if the photoresist stack does not include an ILD, the resist pattern formed by development can be transferred into a metal, such as Al, Cu, Ag, or alloys thereof, to form a structure. A dielectric can be deposited over the structure formed thereof and polished to reveal the metallic interconnect structure.

Examples of applications for the processes according to the embodiments of the invention disclosed above include diffractive gratings, microfluidic arrays and optical communication structures, including but not limited to Wavelength Division Multiplexers, Wavelength Division Demultiplexers, Wavelength Routers, Wavelength Selectors, and waveguides.

These particular embodiments described herein illustrate the versatility and flexibility of a multilevel, multiwavelength approach. Furthermore, by utilizing a single development step, planarization and depth of focus for a particular level can be mitigated.

The particular embodiments disclosed above are illustrative only, do not encompass all viable permutations as would be apparent to those knowledgeable in the art. The invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for fabricating a dual damascene structure, comprising:

providing a photoresist stack comprising a first photoresist layer on top of a second photoresist layer formed on top of a semiconductor substrate, wherein said first photoresist layer is sensitive to a first wavelength of light and said second photoresist layer is sensitive to a second wavelength of light;

exposing said photoresist stack to a first predetermined pattern of light comprising said first wavelength;

exposing said photoresist stack to a second predetermined pattern of light comprising said second wavelength;

developing said photo-resist layers to form a multi-tiered structure in the photo-resist layers, wherein said photo-resist layers are developed after exposing both the first and second photoresist layers; and transferring the multi-tiered structure into an interlayer dielectric layer of the semiconductor substrate, wherein said interlayer dielectric layer is under said second photoresist layer, wherein said first and second predetermined patterns of light form an image which comprises a line-space pattern and a via pattern.

* * * * *

UNITED STATES PATENT AND TRADEMARK OFFICE
CERTIFICATE OF CORRECTION

PATENT NO. : 7,579,137 B2
APPLICATION NO. : 11/317089
DATED : August 25, 2009
INVENTOR(S) : Colburn et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 801 days.

Signed and Sealed this

Fourteenth Day of September, 2010

David J. Kappos
*Director of the United States Patent and Trademark Office*